(12) United States Patent
Chang

(10) Patent No.: US 9,125,325 B2
(45) Date of Patent: Sep. 1, 2015

(54) CONTAINER MODULE WITH COOLING SYSTEM

(75) Inventor: Yao-Ting Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 515 days.

(21) Appl. No.: 13/526,126

(22) Filed: Jun. 18, 2012

(65) Prior Publication Data

US 2013/0233530 A1    Sep. 12, 2013

(30) Foreign Application Priority Data

Mar. 9, 2012 (TW) .............................. 101108077 A

(51) Int. Cl.
*F25B 7/00*        (2006.01)
*H05K 7/20*       (2006.01)

(52) U.S. Cl.
CPC ................................. *H05K 7/20572* (2013.01)

(58) Field of Classification Search
CPC .......... F25B 7/00; F25D 17/065; Y02B 30/62
USPC ......... 62/79, 180, 203, 412, 419; 165/56, 217
See application file for complete search history.

(56) References Cited

U.S. PATENT DOCUMENTS

| | | | | |
|---|---|---|---|---|
| 4,175,401 A | * | 11/1979 | McManus | 62/180 |
| 4,244,193 A | * | 1/1981 | Haakenson | 62/180 |
| 4,474,021 A | * | 10/1984 | Harband | 62/94 |
| 5,241,829 A | * | 9/1993 | Irie et al. | 62/79 |
| 5,729,993 A | * | 3/1998 | Boiarski et al. | 62/175 |

* cited by examiner

*Primary Examiner* — Melvin Jones
(74) *Attorney, Agent, or Firm* — Novak Druce Connolly Bove + Quigg LLP

(57) ABSTRACT

A container module includes a first container, a second container, a first passage and a second passage, a first fan and a second fan. The first passage and the second passage each are connected between the two containers. The two fans are installed at corresponding two junctions in the corresponding two passages, which can control the drawing and exhausting of the airflow between the two containers.

6 Claims, 6 Drawing Sheets

CONTAINER MODULE WITH COOLING SYSTEM

BACKGROUND

1. Technical Field

The disclosure generally relates to a container module including a cooling system.

2. Description of Related Art

To quickly establish a cloud operating system, a container is typically used as a room for the cloud operating system. When designing a container for containing multiple computer servers, an air conditioner is located in the container for controlling the temperature to a desirable level to cool the computer servers.

However, if there are multiple containers, each container has one air conditioner. When the air conditioners are operating, high amounts of power are consumed. Additionally, even if some of the containers need less cooling, all air conditioners still operate, wasting power.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary container module with cooling system. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
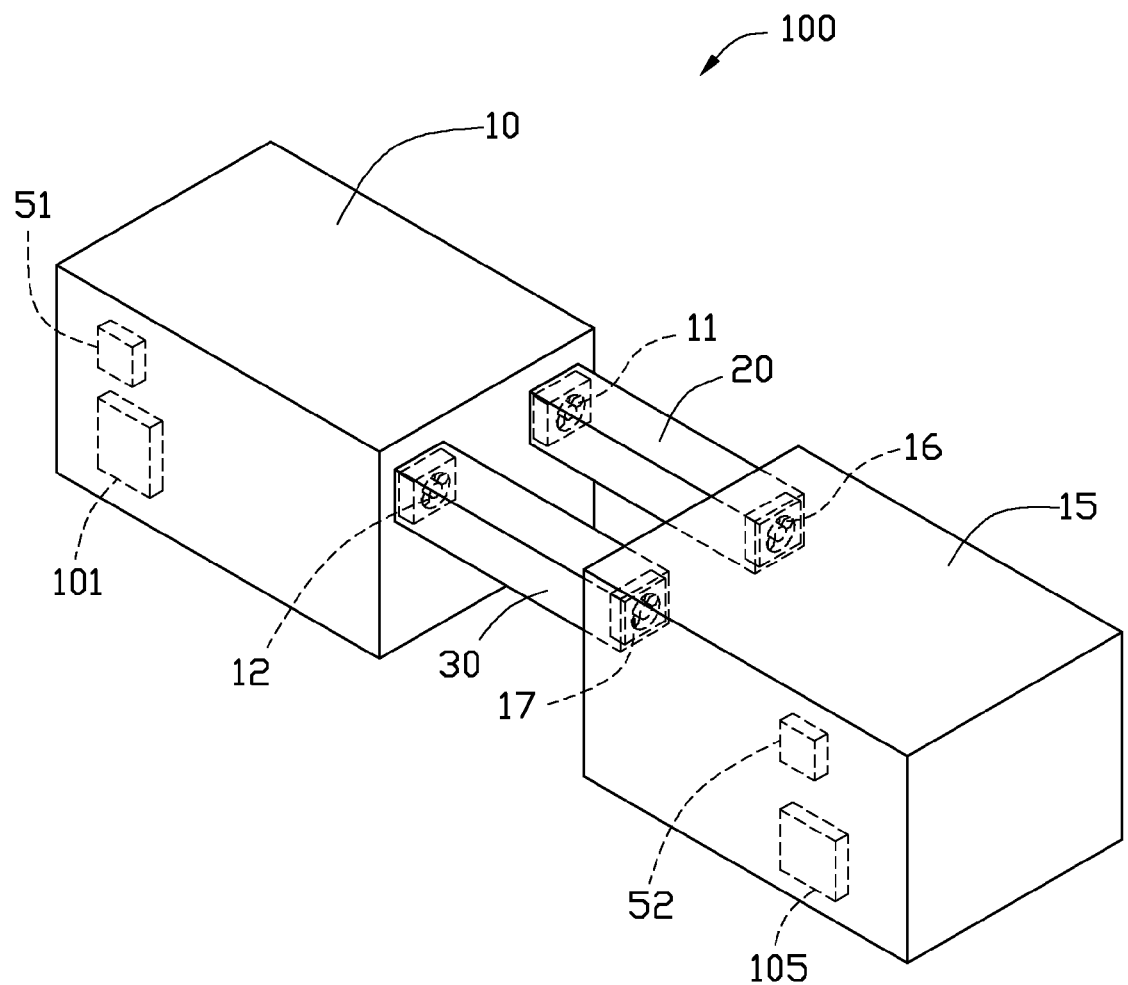
FIG. 1 is a schematic view of an embodiment of a container module including a cooling system.

FIG. 1 shows a container module 100 used for housing telecommunication components, such as computer servers. In this exemplary embodiment, the container module 100 includes a first container 10, a second container 15, a first passage 20, and a second passage 30. The first container 10 and the second container 15 are positioned adjacent to each other for accommodating the computer servers. The first passage 20 allows cold airflow to pass through, and the second passage 30 allows hot airflow to pass through. Opposite ends of the first passage 20 and the second passage 30 are respectively connected to the first container 10 and the second container 15 for allowing hot airflow and cold airflow to flow between the first container 10 and the second container 15.

The first container 10 includes a first air conditioner 101, a first fan 11, a second fan 12. The first fan 11 is located at a junction between the first container 10 and the first passage 20 and draws cold air into the first container 10. The second fan 12 is located at a junction between the first container 10 and the second passage 30 for exhausting hot air out of the first container 10. A first sensor 51 is positioned in the first container 10 for detecting a temperature in the first container 10. The second container 15 includes a second air conditioner 105, a third fan 16 and a fourth fan 17. The third fan 16 is located at a junction between the second container 15 and the first passage 20 and draws cold air into the second container 15. The fourth fan 17 is located at a junction between the second container 15 and the second passage 30 for exhausting cold air from the second container 15. A second sensor 52 is positioned in the second container 15 for detecting a temperature in the second container 15.

Figure 2:
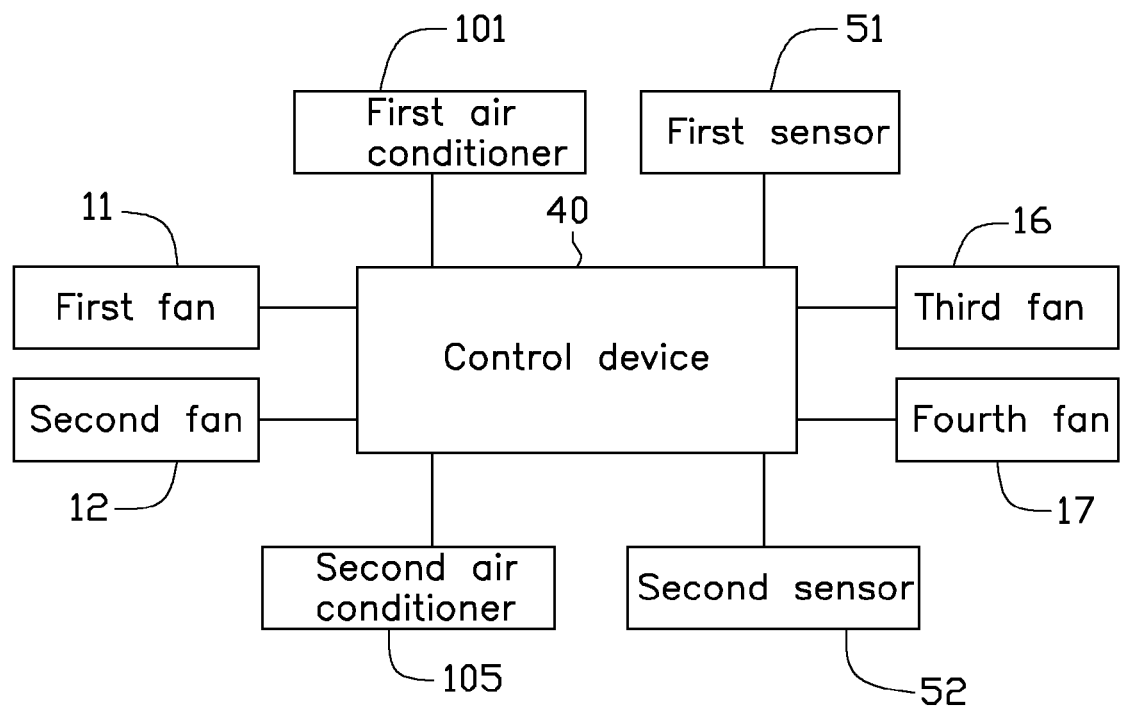
FIG. 2 is a block diagram depicting the control system for controlling the container module.

FIG. 2, illustrates a control device 40 is electronically connected to the first air conditioner 101, the second air conditioner 105, and the fans 11, 12, 16, 17 for activating/deactivating the above elements. The first sensor 51 and the second sensor 52 are electronically connected to the control device 40. The first sensor 51 and the second sensor 52 can detect a temperature of the containers 10, 15, respectively and transmit a signal to the control device 40. The signals cause the control device 40 to activate/deactivate the first air conditioner 101, the second air conditioner 105, and the fans 11, 12, 16, 17.

Figure 3A:
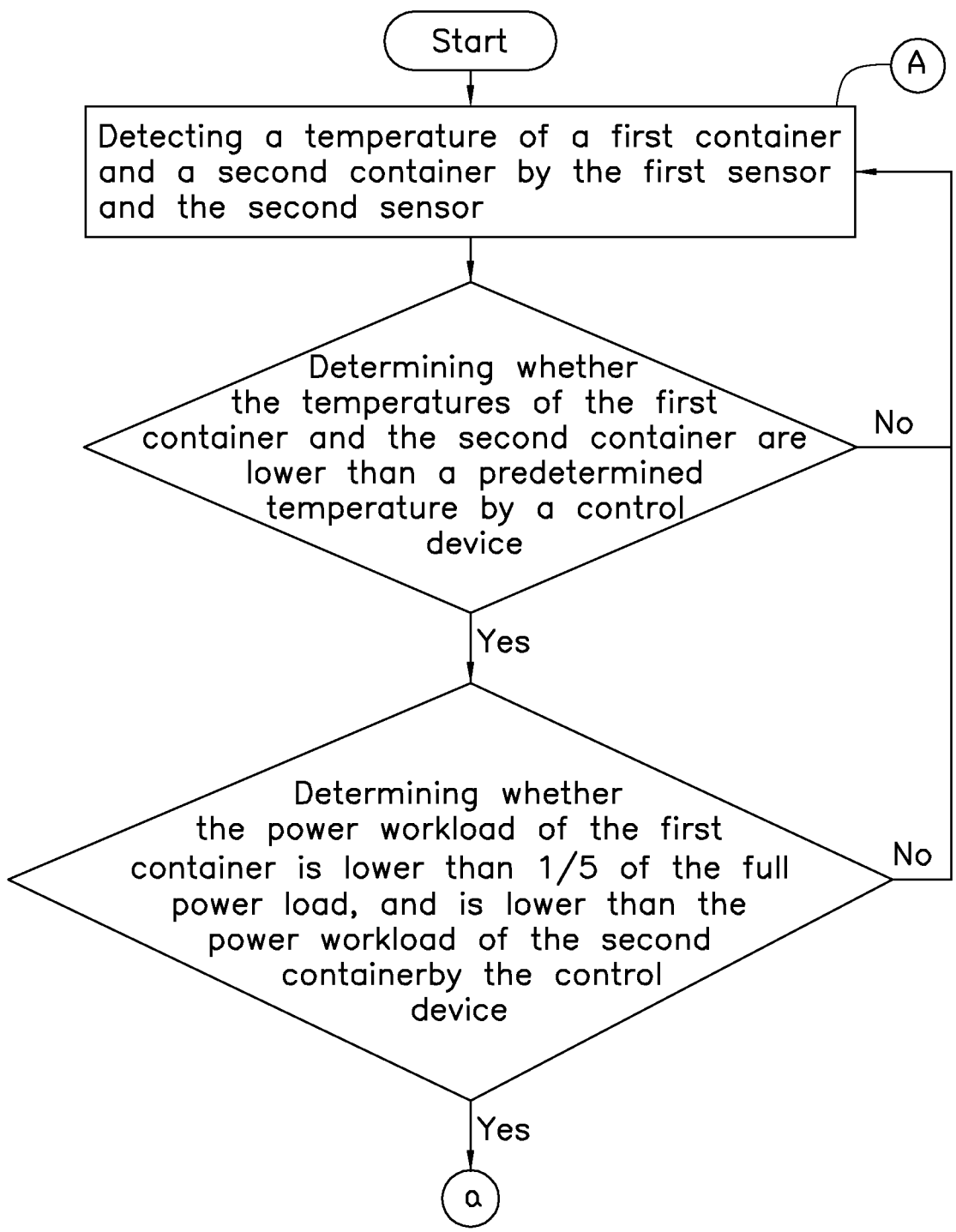
FIGS. 3A and 3B are flowcharts illustrating a cooling method of the cooling system in FIG. 1, describing the process of the second air conditioner cooling the first container.
Figure 3B:
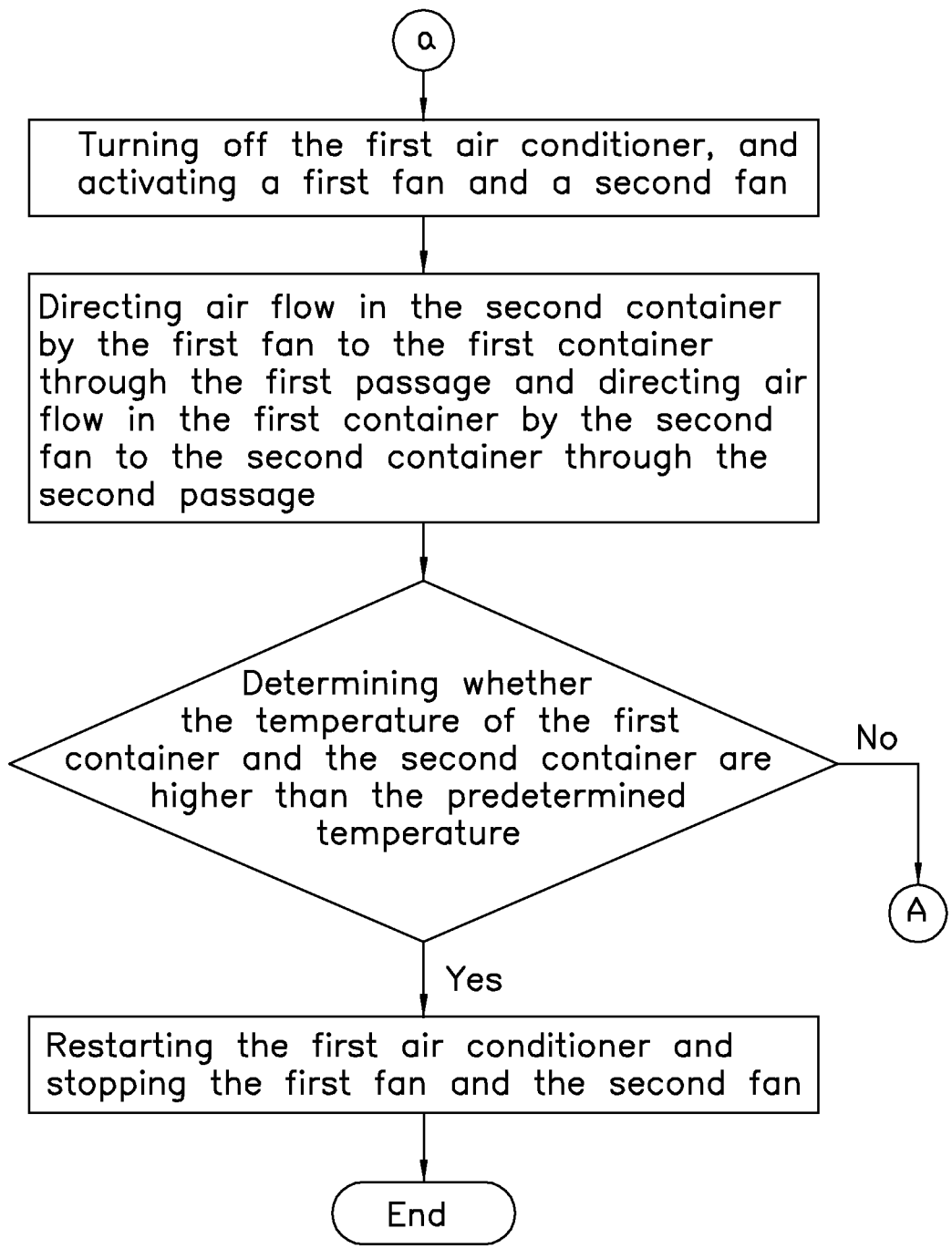

Initially, the first air conditioner 101 and the second air conditioner 102 are both turned on. FIGS. 3A and 3B, show a cooling method in which the second air conditioner cools both the first and second containers. The cooling method includes at least the following steps:

The first and second sensors 51, 52 detect a temperature of the corresponding first and second containers 10, 15, respectively, and transmit the detected temperature value to the control device 40. The control device 40 determines whether the temperatures of the first container 10 and the second container 15 are less than a predetermined temperature, for example, 25° C. If the temperature of the first container 10 and the second container 15 are less than the predetermined temperature, the control device 40 determines the workload of the first air conditioner 101. If the temperature of the first container 10 and the second container 15 exceeds the predetermined temperature, the process will keep returning to the first step to continuously detect the temperature of the first container 10 and the second container 15.

If the control device 40 determines the power workload of the first container 10 is less than a part of the full power load (e.g. ⅕ of the full power load), and less than the power workload of the second container 15, the control device 40 will transmit a signal to turn off the first air conditioner 101. Simultaneously, the first fan 11 and the second fan 12 are activated by the control device 40. The first fan 11 directs cold air in the second container 15 to the first container 10 through the first passage 20. The second fan 12 directs the hot air in the first container 10 to the second container 15 through the second passage 30. Accordingly, the first container 10 is cooled by the excess output of the second air conditioner 105.

If the power workload of the first container 10 exceeds, e.g., the exemplary ⅕ of the full power load, and exceeds the power workload of the second container 15, the process will keep going to the first step to continuously detect the temperature of the first container 10 and the second container 15. The first sensor 51 and the second sensor 52 continue monitoring and recording the temperatures of the first container 10 and the second container 15. The control device 40 determines whether the temperatures of the first container 10 and the second container 15 exceed the predetermined temperature. If the temperature of the first container 10 and the second container 15 exceeds the predetermined temperature, the control device 40 will restart the first air conditioner 101, and stop the first fan 11 and the second fan 12. If the temperature of the first container 10 and the second container 15 are less than the predetermined temperature, the process will keep returning to the first step to continuously detect the temperature of the first container 10 and the second container 15.

Figure 4A:
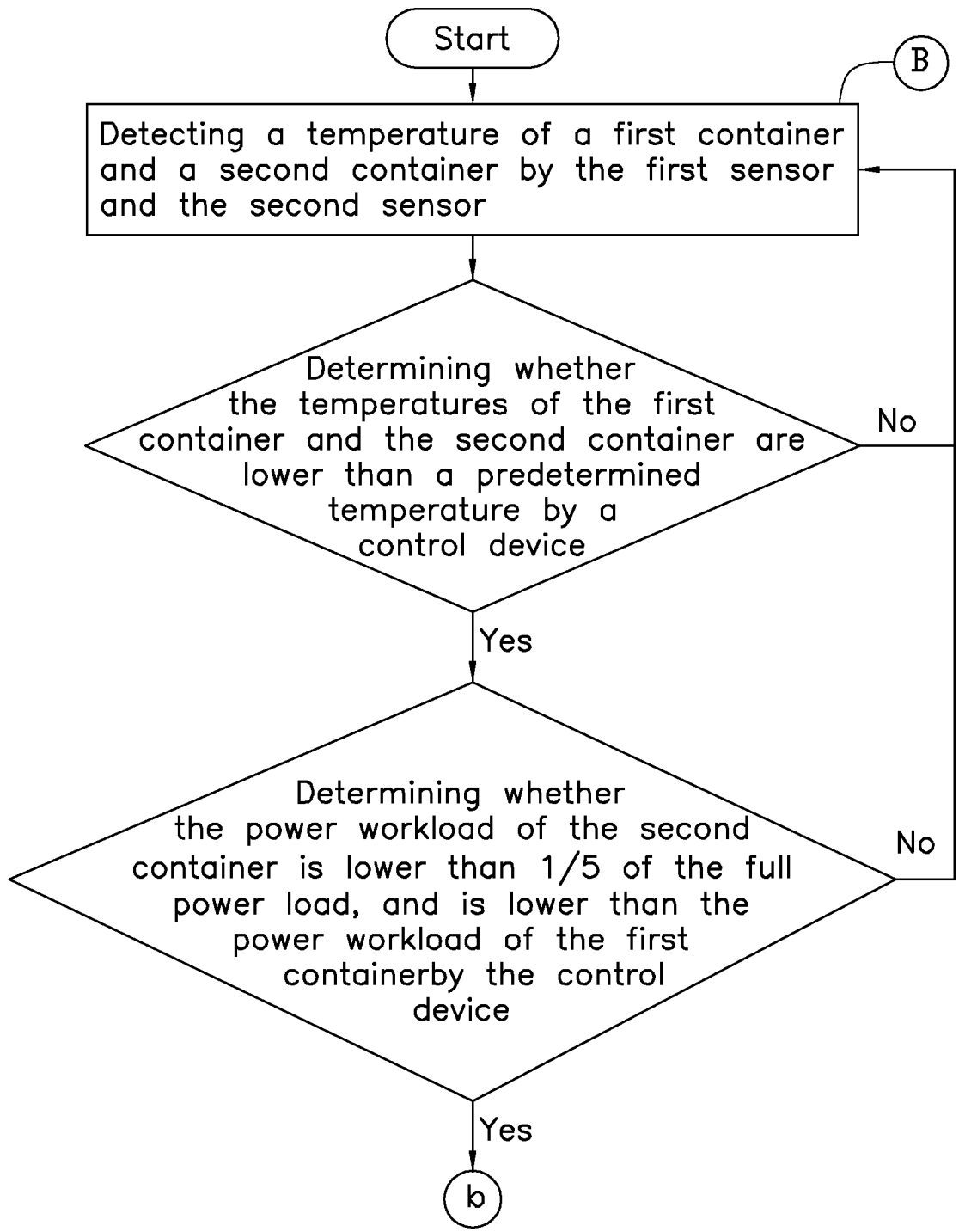
FIGS. 4A and 4B are flowcharts illustrating a cooling method of the cooling system in FIG. 1, describing the process of the fir air conditioner cooling the second container.
Figure 4B:
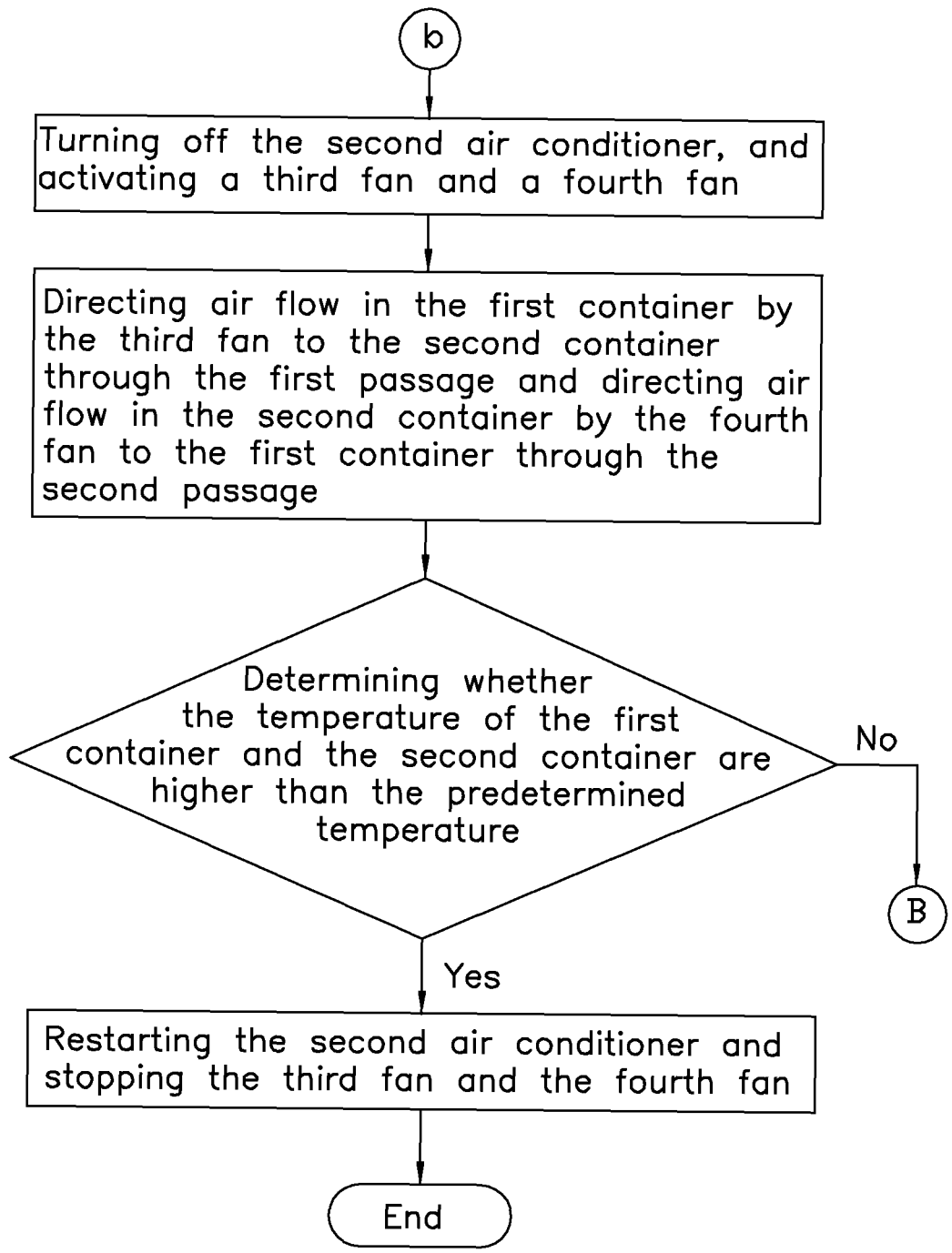

FIGS. 4A and 4B, show a cooling method of the aforementioned cooling system in which the first air conditioner cools both the first and second containers. The cooling method includes at least the following steps:

The first sensor 51 detects a temperature of the first container 10, and the second sensor 52 detects a temperature of the second container 15. The first sensor 51 and the second sensor 52 transmit the detected temperature value to the control device 40. The control device 40 determines whether the temperatures of the first container 10 and the second container 15 are less than a predetermined temperature, for example, 25° C. If the temperature of the first container 10 and the second container 15 are less than the predetermined temperature, the control device 40 will continue to determine the power workload of the second air conditioner 101. If the temperature of the first container 10 and the second container 15 exceeds the predetermined temperature, the process will keep returning to the first step to continuously detect the temperature of the first container 10 and the second container 15.

The control device 40 determines whether the power workload of the second container 15 is less than a part of the full power load (e.g. ⅕ of the full load), and is less than the workload of the first container 10, the control device 40 transmits a signal to turn off the second air conditioner 105. At the same time, the third fan 16 and the fourth fan 17 are activated. The third fan 16 directs the cold air in the first container 10 to the second container 15 through the first passage 20. The fourth fan 17 directs the hot air in the second container 15 to the first container 10 through the second passage 30. Accordingly, the second container 15 is cooled by the first air conditioner 101.

If the power workload of the second container 15 exceeds, e.g., the exemplary ⅕ of the full power load, and exceeds the power workload of the first container 10, the process the process will keep returning to the first step to continuously detect the temperature of the first container 10 and the second container 15. The first sensor 51 and the second sensor 52 will monitor and record the temperatures of the first container 10 and the second container 15. The control device 40 determines whether the temperatures of the first container 10 and the second container 15 exceed the predetermined temperature. If the temperature of the first container 10 and the second container 15 exceeds the predetermined temperature, the control device 40 will restart the second air conditioner 105, and stop the third fan 16 and the fourth fan 17. If the temperature of the first container 10 and the second container 15 are less than the predetermined temperature, the process the process will keep returning to the first step to continuously detect the temperature of the first container 10 and the second container 15.

The container module of the present disclosure may use an air conditioner to cool the first container and the second container, preventing waste power.

It is to be understood, however, that even through numerous characteristics and advantages of the disclosure have been set forth in the foregoing description, together with details of the system and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A container module comprising:
   a first container;
   a second container;
   a first passage and a second passage each connected to the first container and the second container; and
   a first fan and a second fan, the first fan installed at a junction between the first container and the first passage, the second fan installed at a junction between the first container and the second passage;
   wherein the first fan draws air in the second container to enter the first container through the first passage, the second fan exhausts air from the first container to the second container.

2. The container module as claimed in claim 1, further comprising a third fan and a fourth fan, wherein the third fan is located at a junction between the second container and the first passage, the fourth fan is located at a junction between the second container and the second passage.

3. The container module as claimed in claim 2, further comprising a control device, a first sensor, and a second sensor, the first sensor is positioned in the first container for detecting a temperature in the first container, the second sensor is positioned in the second container for detecting a temperature in the second container, the control device receives signals of the first sensor and the second sensor for activating/deactivating the first fan, the second fan, the third fan and the fourth fan.

4. The container module as claimed in claim 1, wherein the first passage allows cold air to pass through, and the second passage allows hot air to pass through.

5. A cooling method of a container module comprising the steps:
   detecting a temperature of a first container and a second container by a first sensor and a second sensor of the container module, respectively;
   using a control device to determine whether the temperature of the first container and the second container is less than a predetermined temperature;
   using the control device to determine whether a power workload of the first container is less than a full load of the first container, and is less than a power workload of the second container if the temperatures of the first container and the second container are less than the predetermined temperature;
   turning off a first air conditioner, and activating a first fan and a second fan if the control device determines the power workload of the first container is less than full load and is less than the power workload of the second container;
   directing air in the second container by the first fan to the first container through the first passage and directing air in the first container by the second fan to the second container through the second passage;
   determining whether the temperature of the first container and the second container exceeds the predetermined temperature;
   restarting the first air conditioner and stopping the first fan and the second fan if the temperature of the first container and the second container exceeds the predetermined temperature.

6. A cooling method of a container module comprising the steps:
   detecting a temperature of a first container and a second container by a first sensor and a second sensor of the container module;

using a control device to determine whether the temperature of the first container and the second container is less than a predetermined temperature;
using a control device to determine whether a power workload of the second container is less than a full load of the second container, and is less than a power workload of the first container if the temperatures of the first container and the second container are less than the predetermined temperature;
turning off a second air conditioner in the second container, and activating a third fan and a fourth fan if the control device determines the power workload of the second container is less than the full load of the second container and is less than the power workload of the first container;
directing air in the first container by the third fan to the second container through the first passage and directing air in the second container by the fourth fan to the first container through the second passage;
determining whether the temperature of the first container and the second container exceeds the predetermined temperature;
restarting the second air conditioner and stopping the third fan and the fourth fan.

* * * * *